United States Patent [19]
Huang et al.

[11] Patent Number: 6,078,492
[45] Date of Patent: Jun. 20, 2000

[54] STRUCTURE OF A CAPACITOR IN A SEMICONDUCTOR DEVICE HAVING A SELF ALIGN CONTACT WINDOW WHICH HAS A SLANTED SIDEWALL

[75] Inventors: Kuo-Tai Huang; Wen-Yi Hsieh, both of Hsinchu; Tri-Rung Yew, Hsinchu Hsien, all of Taiwan

[73] Assignee: United Microelectronics Corp., Hsinchu, Taiwan

[21] Appl. No.: 09/128,364

[22] Filed: Aug. 3, 1998

[30] Foreign Application Priority Data

Apr. 21, 1998 [TW] Taiwan ................................. 87106060

[51] Int. Cl.[7] ............................. H01G 4/30; H01G 4/008
[52] U.S. Cl. ................... 361/301.4; 361/305; 361/306.3; 361/321.5; 257/303; 257/306
[58] Field of Search ................................. 361/301.4, 303, 361/305, 306.3, 311–313, 321.5; 257/303, 301, 295–296, 306, 308, 906, 346

[56] References Cited

U.S. PATENT DOCUMENTS

| | | | |
|---|---|---|---|
| 4,845,539 | 7/1989 | Inoue | 257/330 |
| 5,672,543 | 9/1997 | Chang et al. | 438/653 |
| 5,918,120 | 6/1999 | Huang | 438/239 |
| 5,936,273 | 8/1999 | Chen | 257/306 |
| 5,952,687 | 9/1999 | Kawakubo et al. | 257/296 |

*Primary Examiner*—Kristine Kincaid
*Assistant Examiner*—Anthony Dinkins
*Attorney, Agent, or Firm*—Thomas, Kayden, Horstemeyer & Risley

[57] ABSTRACT

A structure of a capacitor includes two gates and a commonly used source/drain region on a substrate. Then, a pitted self align contact window (PSACW) partly exposes the commonly used source/drain region. Then an glue/barrier layer and a lower electrode of the capacitor are over the PSACW. Then a dielectric thin film with a material having high dielectric constant is over the lower electrode. Then, an upper electrode is over the dielectric thin film to complete a capacitor, which has a structure of metal insulator metal with a shape like the PSACW.

15 Claims, 7 Drawing Sheets

STRUCTURE OF A CAPACITOR IN A SEMICONDUCTOR DEVICE HAVING A SELF ALIGN CONTACT WINDOW WHICH HAS A SLANTED SIDEWALL

BACKGROUND OF THE INVENTION

1. Field of the Invention

This invention relates to a structure of a capacitor in a semiconductor device, and more particularly to a structure of a capacitor in a dynamic random access memory (DRAM) device.

2. Description of Related Art

For memory devices with high integration such as DRAM devices with memory capacity of 256 Megabit, their capacitor need a dielectric thin film to be constructed as the three dimensional structures like stacked type or trench type. Thus these memory devices should have a large area of the dielectric thin film to store the charge to avoid the soft error. Utilizing a method of the low pressure chemical vapor deposition (LPCVD), which is one of applications of the chemical vapor deposition (CVD), to make the dielectric thin film made of $Ta_2O_5$ is popular for the present because this material produces a dielectric constant about 25, which is far larger than that of oxide, and has a better ability of step coverage. The step coverage means that the covering surface is kept in a step shape without being rounded.

In the design of a very large scale integration circuit (VLSI), to increase the capacitance in the integrated circuits (ICs), it has three effective methods. The first is that the thickness of the dielectric thin film mediated between two electrodes is reduced because the capacitance is inversely proportional to the distance between these two electrodes. This method can increase the capacitance effectively but is difficult to be controlled to obtain a uniform and stable dielectric thin film. The second method is that the interfacial area between the dielectric thin film and the electrode is increased because the capacitance is proportional to the size of this area. For the present, to increase the size of the interfacial area, such as a fin type or a hemispheric grain type is applied but has a difficulty for massive production due to the complexity of fabrication. Another option is taking a cylindrical type. The third method is that the dielectric constant is increased such as the materials of $Ta_2O_5$, Lead Zirconium Titanate (PZT) composed of $Pb(Zr,Ti)O_3$, and Bismuth Strontium Titanate (BST) composed of $(Ba,Sr)TiO_3$, which have high dielectric constant.

In the conventional method of fabricating a semiconductor device, a polysilicon material is usually to be taken for the electrodes of the capacitors. In this case, the higher the temperature is used in the process of annealing on the dielectric thin film, the lesser the defect exists in the dielectric thin film. This means the quality of the dielectric thin film should be better. But, if the temperatures used in the process of annealing is too high, an native oxide is easily produced around the interface between the dielectric thin film and the lower electrode to reduce the capacitance. Here, it doesn't happen around an interface between the dielectric thin film and an upper electrode because the upper interface has not been formed yet. On the contrary, if the temperatures used in the process of annealing is too low, and then the defect existing in the dielectric thin film could not effectively be removed.

Therefore, so far, to prevent the bad situations as described above, a metal layer, generally, is taken instead for the electrodes, which is usually made of a polysilicon layer in the old method. That is to say a metal insulator metal (MIM) capacitor, which is especially applied in a nonvolatile ferroelectric memory (FeRAM) and a DRAM with high integration.

The metal layer of the MIM capacitor is usually made of conductive materials such as Platinum, Iridium, Iridium oxide or Ruthenium oxide. Unfortunately, the conventional MIM capacitor usually has a thick lower electrode, on which the etching is complicate and taking time. Except this, it has another problem that because the profile of the pitted contact window is usually steeper, it causes not only the difficulty of the alignment of a source/drain region but also the bad quality of the ability of the step coverage. It is therefore that the filling of a layer of polysilicon and an glue/barrier layer into the pitted contact window should be done before the material for the lower electrode is filled in. This causes the complexity of the fabrication.

FIG. 1A through FIG. 1H illustrate the sectional plots of a capacitor of a DRAM in the conventional fabricating procedure. The like marks represent the like elements in the FIGs.

Referring to FIG. 1A, two gates 102 with an identical structure but only one being marked are shown in the figure over a substrate 100 on a substrate surface 101. The FIG. 1A further includes a source/drain region 110 and a commonly used source/drain region 110a between the gates 102 under the substrate surface 101. One of gates 102 with marks has a doped polysilicon layer 106 covered by a spacer 104 and a cap layer 108. The source/drain region 110 and the commonly used source/drain region 110a are the doped area with a structure of lightly doped drain (LDD) and can be formed by doing the ion implantation, in which the structure of the gates 102 is treated as the mask. The lightly doped areas, located on the fringe of the source/drain region 110 and the commonly used source/drain region 110a with shallower depth, are formed first before the spacer 104 is formed. A slightly heavier doped areas with deeper depth are formed on the central part of the source/drain region 110 and the commonly used source/drain region 110a after the spacer 104 is formed. The spacer 104 typically is made of silicon oxide or silicon nitride. After the source/drain region 110 and the commonly used source/drain region 110a are fully formed, an insulating layer 112 is formed over the substrate 100 and the gates 102.

Referring FIG. 1A and FIG. 1B, by utilizing the etching technology, a contact window 111 is defined on the insulating layer 112 to become an insulating layer 112a. The contact window 111 exposes part of the commonly used source/drain region 110a.

Referring FIG. 1B and FIG. 1C, a polysilicon layer 114 preferably made of doped polysilicon by the method of LPCVD is formed over the insulating layer 112a with the contact window 111 being filled.

Referring FIG. 1C and FIG. 1D, by utilizing a process of etch back, the polysilicon layer 114 is etched gradually until the insulating layer 112a has been exposed partly. After this procedure the polysilicon layer 114 becomes a polysilicon layer 114a.

Referring FIG. 1D and FIG. 1E, an glue/barrier layer 116 preferably made of Ti/TiAlN, respectively, is formed over the polysilicon layer 114a. Then the process of annealing is operated immediately. This process creates a $TiSi_2$ layer 117 around the interface between the polysilicon layer 114a and the glue/barrier layer 116. This process also can enhance the ohmic contact between the polysilicon layer 114a and a lower electrode to reduce the resistance. The lower electrode is to be seen in the next FIGs.

Referring FIG. 1E and FIG. 1F, a conductive layer 118 is formed over the glue/barrier layer 116. The conductive layer acts as the lower electrode and is preferably made of one such as Pt, Iridium, Iridium oxide, or Ruthenium oxide by the preferred methods of CVD or sputtering.

Referring FIG. 1F and FIG. 1G, the lower electrode composed of a conductive layer 118a and an glue/barrier layer 116a as mentioned above is defined on both the conductive layer 118 and glue/barrier layer 116 by the photolithography etching technology.

Referring FIG. 1G and FIG. 1H, over a surface 120a, a dielectric thin film 120 is formed with a thickness about between 10 and 60 Angstrom. The dielectric thin film 120 is preferably made of one having high dielectric constant such as $Ta_2O_5$, PZT or BST.

Then, a conductive layer 128 is formed over the dielectric thin film 120 to be an upper electrode and preferably is made of one such as Pt, Iridium, Iridium oxide or Ruthenium oxide and by the preferred methods of CVD or sputtering as done for the lower electrode.

The conventional structure of the MIM capacitor in the DRAM as described above has a number of drawbacks as follows:

1. If the thickness of the lower electrode is too thick for being able to hold more charges, the etching can not easily be done and cracks can easily happen around the interface between the lower electrode and the dielectric thin film to cause the leakage current.

2. The wall of the pitted contact window, almost vertical to the substrate surface, causes the difficulty of the alignment on the glue/barrier layer. Further, because the ability of step coverage for the metal material is poor, before the lower electrode is made, the polysilicon layer and the glue/barrier layer should be filled in the pitted contact window. This increases the complexity of the fabricating procedure.

3. The conventional MIM capacitors are formed on the insulating layer so that the IC with high integration can not be effectively improved due to the distance between the capacitors can not be effectively reduced. This is because a micro-loading, which is a micro-conducting-path, can easily happen between the conventional MIM capacitors if the capacitors are too close.

SUMMARY OF THE INVENTION

It is therefore an objective of this present invention to provide a capacitor having a structure including a number of structured gates, a commonly used source/drain region and a source/drain region on a substrate. Then, applying the fabricating procedure of self align contact (SAC) on an insulating layer, which is over the substrate, to form a pitted self align contact window (PSACW) and allow the commonly used source/drain region to be partly exposed. Next, the PSACW is orderly filled with an glue/barrier layer and a first-conductive-layer. The first-conductive-layer is to be the lower electrode of the capacitor. Next, a dielectric thin film is over the first-conductive-layer. Then a second-conductive-layer, which is to be an upper electrode of the capacitor, is over the dielectric thin film to form an MIM capacitor of the invention, in which the pitted structure results in a concave structure so as to behave as a function of barrier between the adjacent invented MIM capacitors.

In conclusion, the invention has a number of advantages as follows:

1. The invented MIM capacitors are utilizing the structure of the PSACW so that there are barriers between the invented MIM capacitors to solve the micro-loading problem, as mentioned above, and allow the distance between them, possibly, to be reduced.

2. The invention utilizes the procedure of SAC for forming a PSACW so that the etching is easier to be done and the fabricating procedure is simplified. In addition, the invented MIM capacitor has a larger dielectric area due to the PSACW having a slanted side wall, which has the larger dielectric area than a vertical wall in the conventional MIM capacitor.

3. The invention utilizes materials of Ti/TiNx for forming the glue/barrier layer, in which the technology is conventional and should not cause the extra difficulty.

4. The invention utilizes a preferred material of one such as WN, Pt, $RuO_2$, or others with the similar properties to make the lower electrode to avoid the oxidation happening on the TiNx at a high temperature environment generally required by the fabricating procedure.

5. The invention has the lower electrode with much thinner than that of a conventional one so that the etching is easier to be operated and the cracks around the interface between the lower electrode and the dielectric thin film are comparatively prevented. The cracks are easily happened in the conventional MIM capacitors and induce the problem of leakage current.

6. The invention utilizes the metal layer preferably made of Ti to contact with the source/drain region in the process of self aligned silicide (Salicide) so that a SiNx layer is formed automatically around the contact place to enhance the ohmic contact and reduce the resistance.

7. The invention utilizes the fabricating procedure which is compatible with currently available fabricating procedure but for constructing the MIM capacitor of the invention. Therefore, it is easy to modify the conventional fabricating procedure to achieve the production the MIM capacitor of the invention. That is to say that the investors, based on the old available fabricating equipment, need not much effort to achieve the production of the invented MIM capacitor.

BRIEF DESCRIPTION OF DRAWINGS

The invention can be more fully understood by reading the following detailed description of the preferred embodiments, with reference made to the accompanying drawings as follows.

DETAILED DESCRIPTION OF PREFERRED EMBODIMENT

Figure 1A:
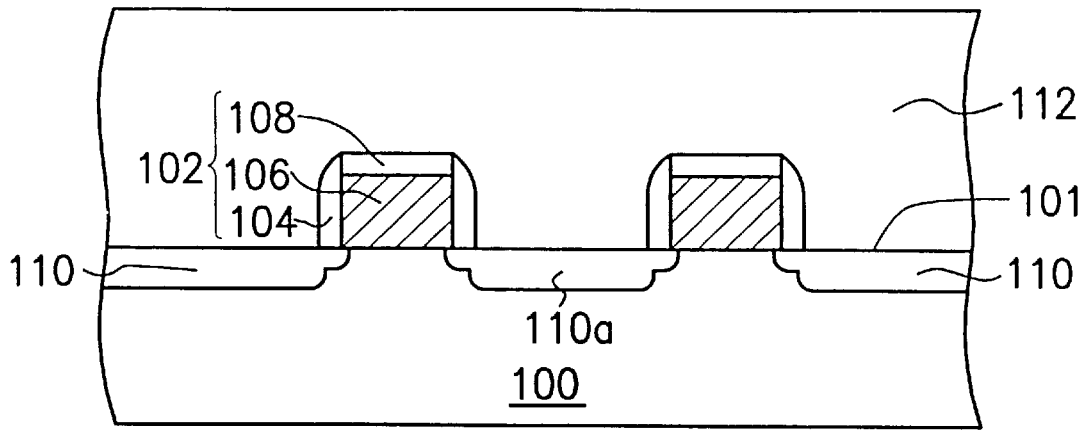
FIG. 1A through FIG. 1H illustrate the sectional plots of a capacitor of a DRAM in the conventional fabricating procedure.
Figure 1B:
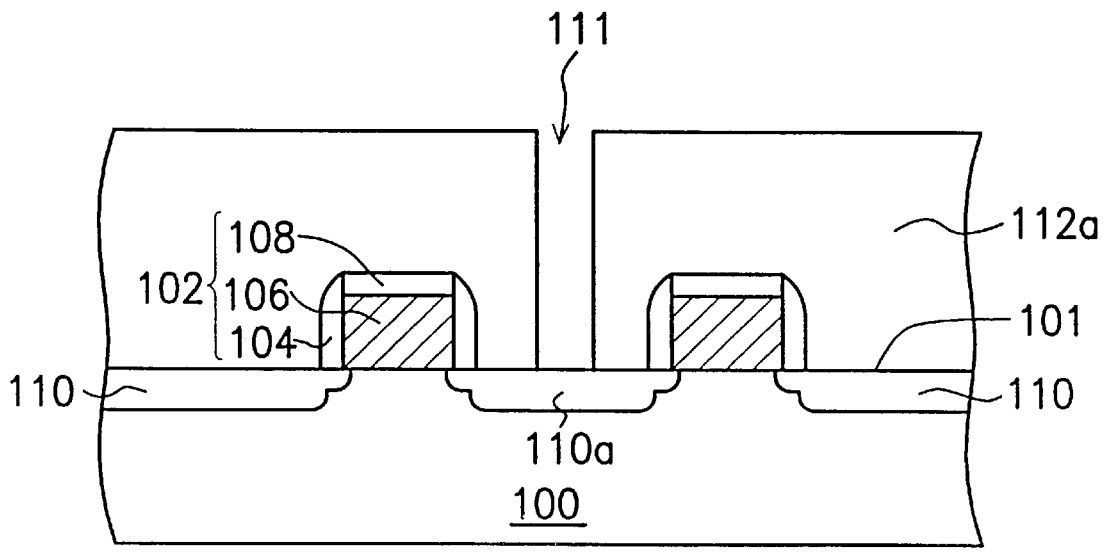
Figure 1C:
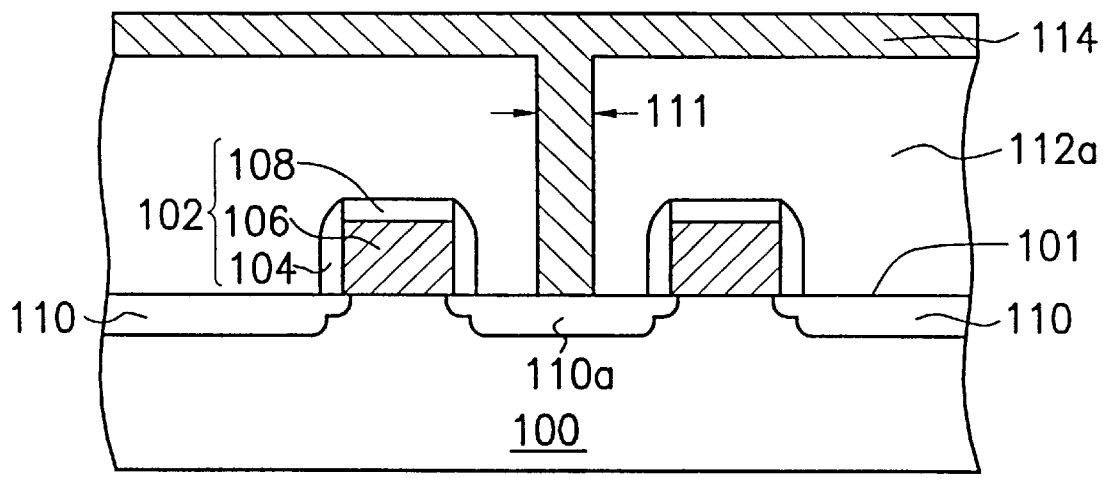
Figure 1D:
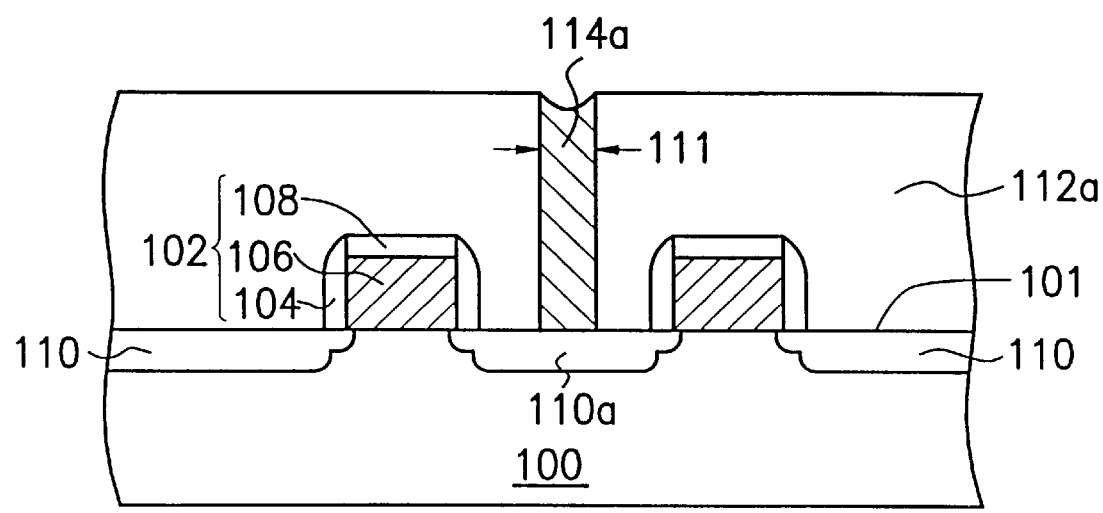
Figure 1E:
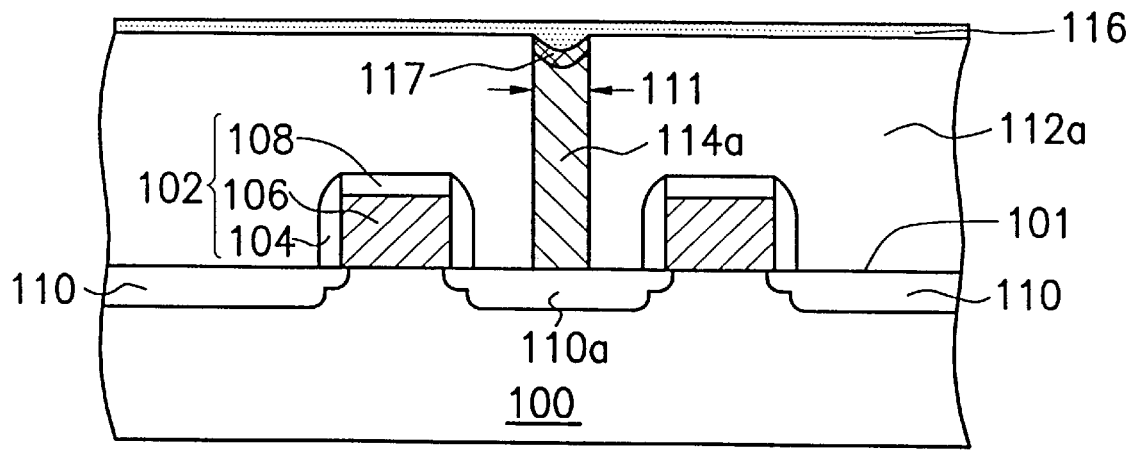
Figure 1F:
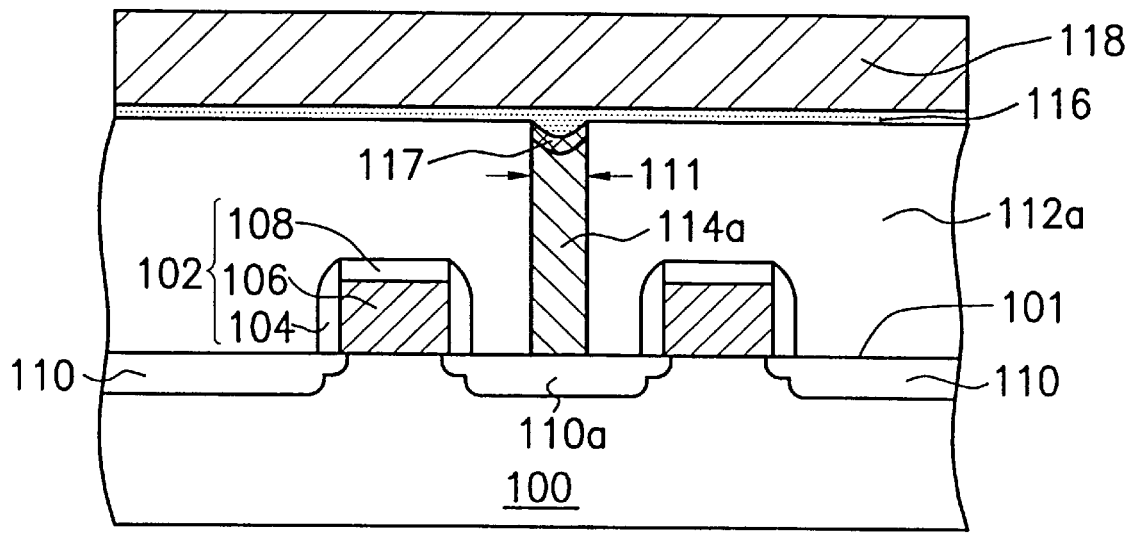
Figure 1G:
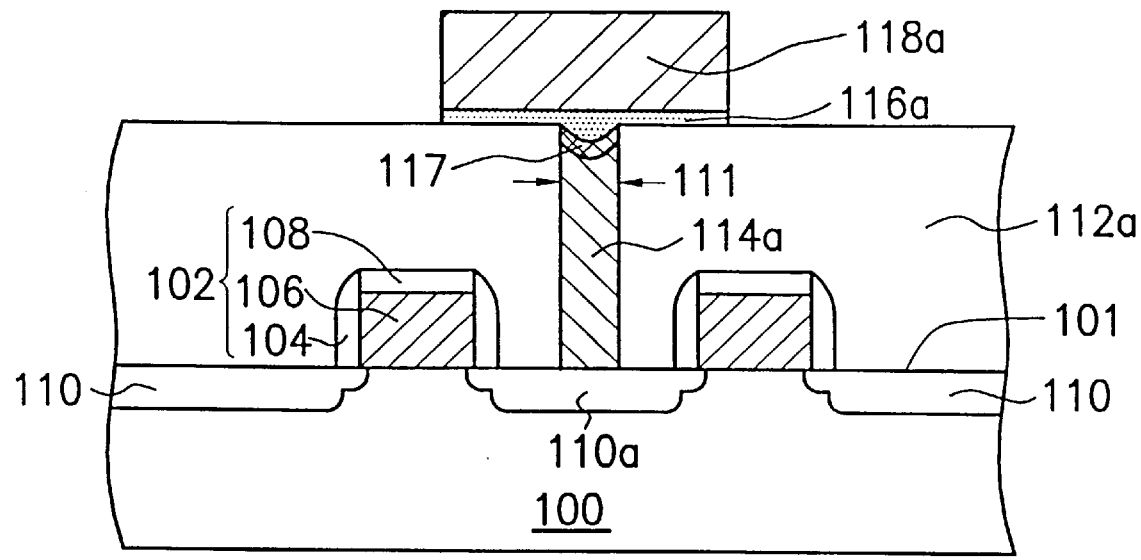
Figure 2A:
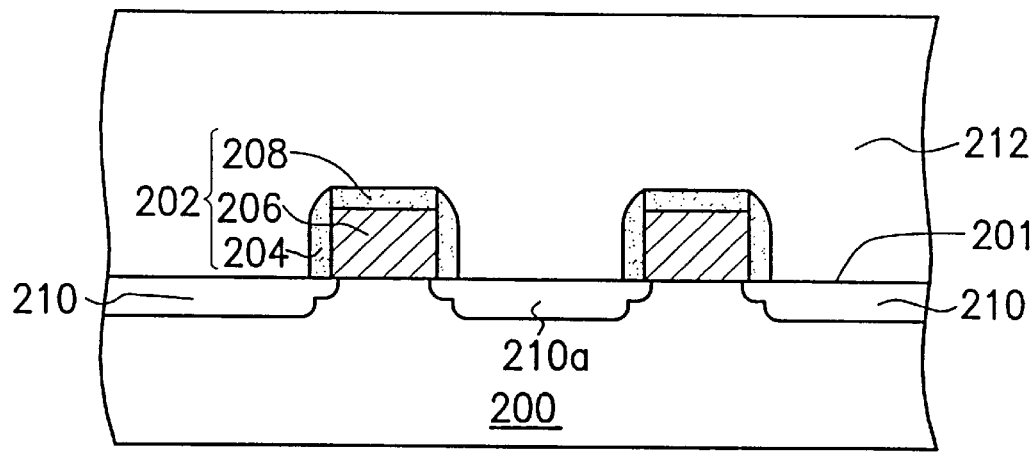
FIG. 2A through FIG. 2F illustrate the sectional plots of a capacitor of a DRAM in the fabricating procedure according to the preferred embodiments of the invention.

FIG. 2A through FIG. 1F illustrate the sectional plots of a capacitor of a DRAM in the fabricating procedure according to the preferred embodiments of the invention. The like marks represent the like elements in the FIGs.

Referring to 2A, two gates 202 with an identical structure but only one being marked are shown in the figure over a substrate 200 on a substrate surface 201. The FIG. 2A further includes a source/drain region 210 and a commonly used source/drain region 210a between the gates 202 under the substrate surface 201. One of gates 202 with marks has a doped polysilicon layer 206 covered by a spacer 204 and a cap layer 208. The source/drain region 210 and commonly used source/drain region 210a are the doped area with a structure of lightly doped drain (LDD) and can be formed by doing the ion implantation, in which the structure of the gates 202 is treated as the mask. A number of lightly doped areas, located on the fringe of the source/drain region 210 and the commonly used source/drain region 210a with shallower depth, are formed first before the spacer 204 is formed. The slightly heavier doped areas with deeper depth are formed on the central part of the source/drain region 210 and the commonly used source/drain region 210a after the spacer 204 is formed. The spacer 204 typically is made of silicon oxide or silicon nitride. After the source/drain region 210 and the commonly used source/drain region 210a are fully formed, an insulating layer 212 is formed over the substrate 200 and the gates 202. The insulating layer 212 can be made by the method of APCVD to include Boron-Phosphpho-Silicate-Glass (BPSG) or Tera-Ethly-Ortho-Silicate (TEOS) silicon dioxide.

Figure 1H:
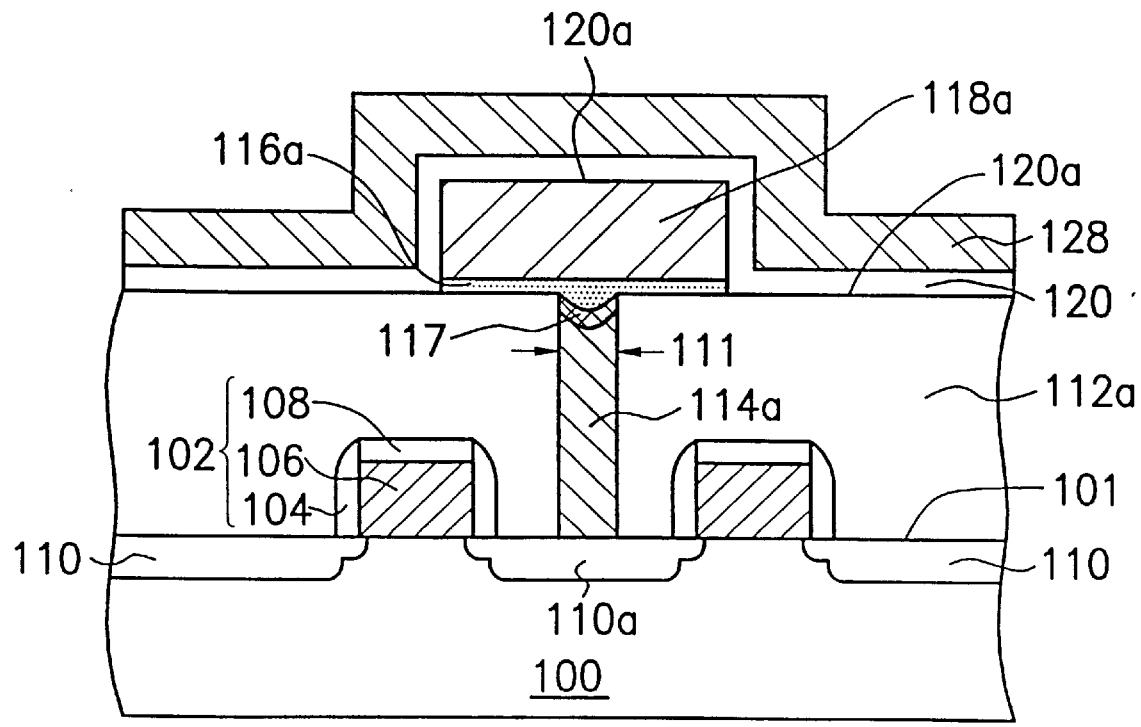
Figure 2B:
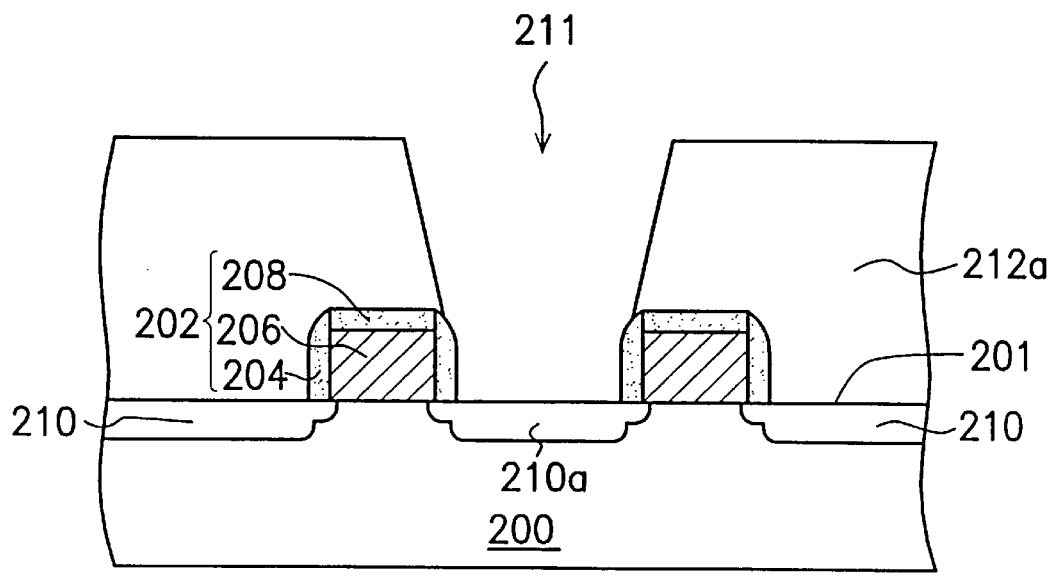

Referring to FIG. 2A and FIG. 2B, by utilizing a technology of self align contact (SAC), a PSACW 211 is defined on the insulating layer 212, which becomes an insulating layer 212a. The advantages of using the technology of SAC to make the PSACW 211 are that the etching can be done more easily and fabricating procedure is more simplified. In addition, the slanted side wall, which is to be seen in the next FIGs, of the PSACW 211 has a larger area than the area in the conventional one, which is the periphery of the contact window 111 as shown in FIG. 1H. Thus, the PSACW can store more charges.

Figure 2C:
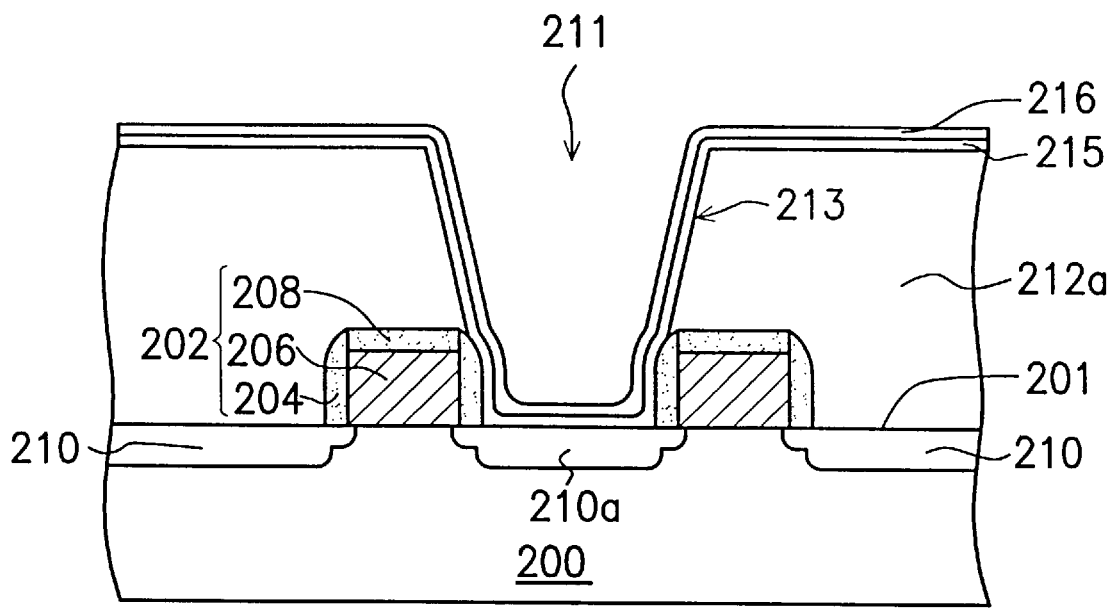

Referring to FIG. 2B and FIG. 2C, a metal layer of Ti 215 is formed over the insulating layer 212a including the slanted side wall 213 of the PSACW 211, and the commonly used source/drain region 210a. Then a TiNx layer 216 is formed over the metal layer of Ti 215. The method of sputtering is the preferred to deposit and form these two layers 215, 216. Thus, the glue/barrier layer can improve the contact quality with a conductive layer. The conductive layer is to be formed in the next procedure. These two layers can avoid the spiking. The materials of Ti/TiNx for forming the glue/barrier layer are the conventional technology so that it should not cause the extra difficulty.

Figure 2D:
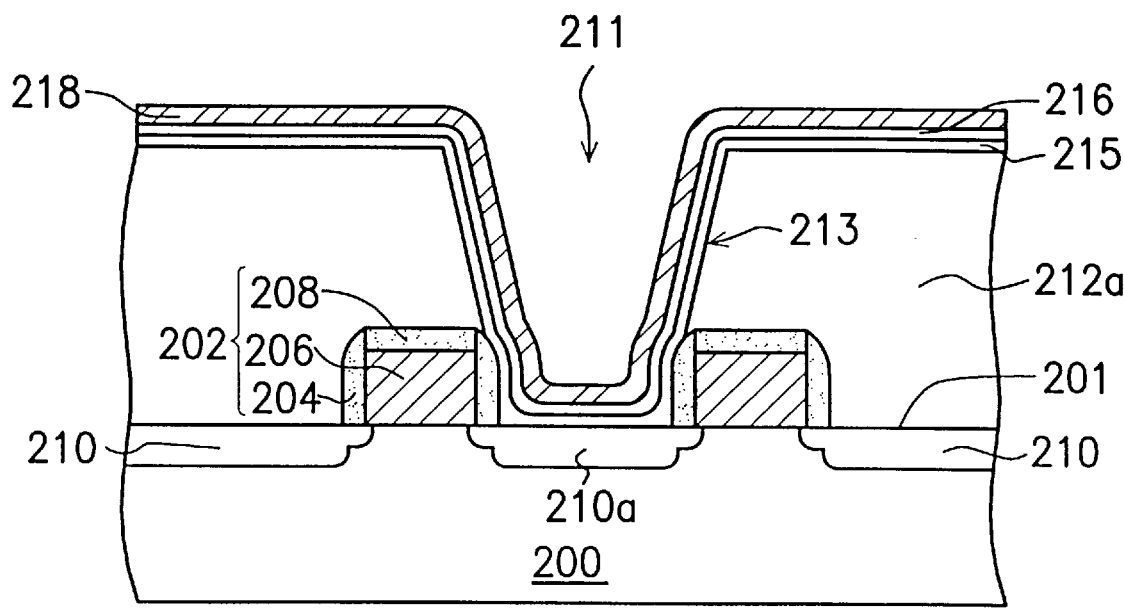

Referring to FIG. 2C and FIG. 2D, the FIG. 2D is the subsequent procedure. The conductive layer 218, as mentioned in the previous FIG., is formed over the SiNx layer 216 to be the lower electrode. The preferred method to form the conductive layer 218 is using sputtering method to deposit a material such as WN, Pt, $RuO_2$, or others with the similar properties. This is because the oxidation of the SiNx layer 216 can happen when the temperature is higher than 400° C., which is generally environment during the fabricating procedure. Moreover, the PSACW has much more surface area for the slanted side wall 213 than the conventional one, the surface 120a on the lower electrode 118a as shown in FIG. 1H. Thus, the thickness of the conductive layer 218 is not necessary to be kept thick so that the etching is easier to be done and the cracks around the interface between the conductive layer 218 and a dielectric thin film are effectively prevented to reduce the leakage current. The dielectric thin film is to be introduced in FIG. 2F.

Figure 2E:
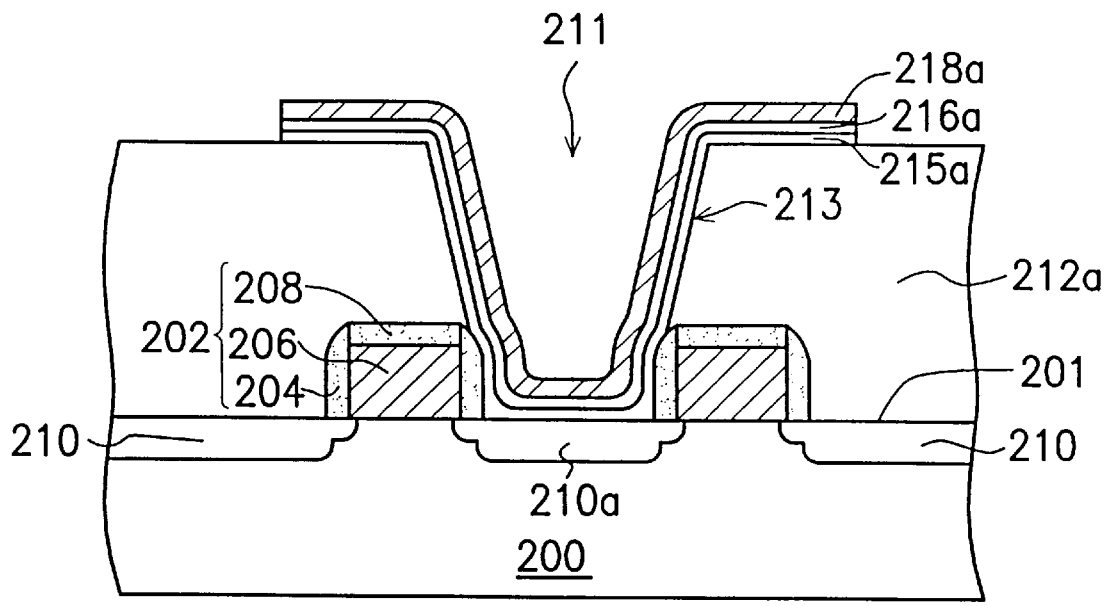

Referring to FIG. 2D and FIG. 2E, the FIG. 2E is the subsequent procedure. Using the technology of etching to define the glue/barrier layer 215a/216a and the conductive layer 218a on the glue/barrier layer 215/216 and the conductive layer 218 to be treated as the lower electrode of the MIM capacitor of the invention.

Figure 2F:
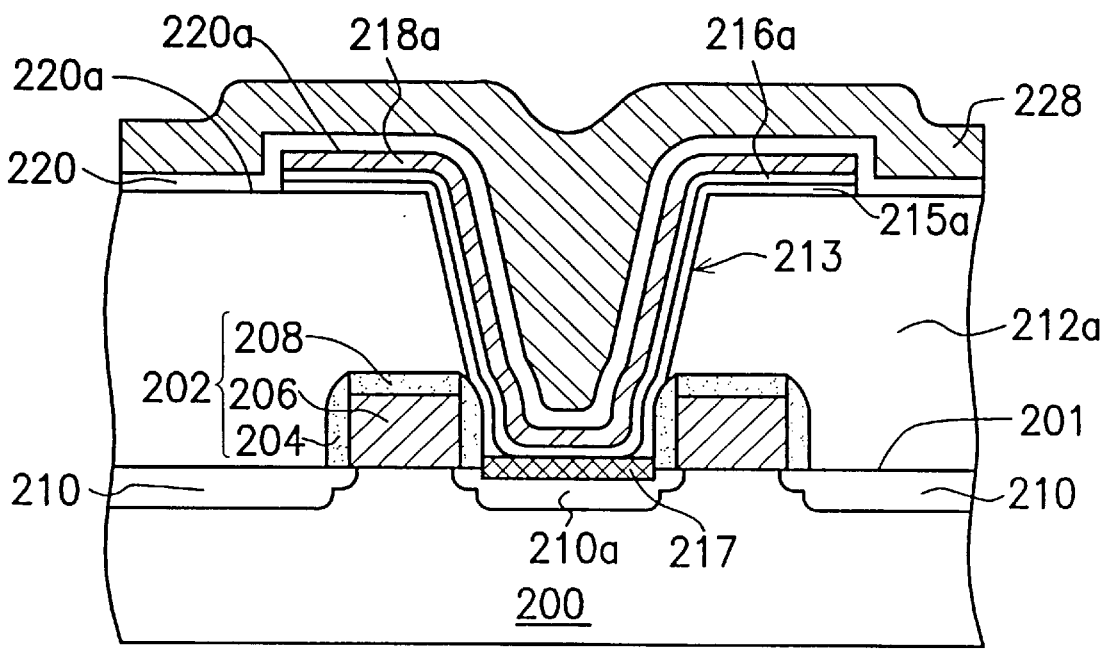

Referring to FIG. 2E and FIG. 2F, a dielectric thin film 220 is formed over a surface 220a with a thickness about between 10 and 60 Angstrom. The dielectric thin film 220 preferably includes a material with high dielectric constant such as $Ta_2O_5$, PZT, BST or others with similar properties by using the preferred method of CVD. The temperature during the operation of the CVD is usually high enough to produce a silicide such as a $TiSi_2$ layer 217, which is around the interface between the commonly used source/drain region 210a and the glue/barrier layer 215a to increase the ohmic contact and reduce the resistance on the PSACW 211. Then a conductive layer 228 is formed over the dielectric thin film 220 to be an upper electrode of the MIM capacitor of the invention. The preferred method to form the conductive layer 228 is using sputtering method to deposit a material such as WN, Pt, $RuO_2$, or others with the similar properties.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A capacitor, comprising:
   a substrate, wherein a transistor having a gate and a source/drain region is formed on the substrate;
   an insulating layer over at least the transistor, wherein there is a self align contact window through the insulating layer exposing the source/drain region and wherein the self align contact window has a slanted side wall;
   a first metal layer on the slanted side wall of the self align contact window and on the source/drain region, wherein the first metal layer serves as a lower electrode of the capacitor;
   a dielectric layer covering the first metal layer; and
   a second metal layer covering the dielectric layer, wherein the second metal layer serves as an upper electrode of the capacitor.

2. The structure of claim 1, wherein the insulating layer includes silicon oxide.

3. The structure of claim 1, wherein the first metal layer includes Tungsten (W).

4. The structure of claim 1, wherein the first metal layer includes Platinum (Pt).

5. The structure of claim 1, wherein the first metal layer includes Ruthenium (Ru).

6. The structure of claim 1, wherein the dielectric layer includes $Ta_2O_5$.

7. The structure of claim 1, wherein the dielectric layer includes $Pb(Zr,Ti)O_3$ (PZT).

8. The structure of claim 1, wherein the dielectric layer includes $(Ba,Sr)TiO_3$ (BST).

9. The structure of claim 1, wherein the second metal layer includes Tungsten.

10. The structure of claim 1, wherein the second metal layer includes Platinum.

11. The structure of claim 1, wherein the second metal layer includes Ruthenium.

12. The structure of claim 1, wherein a glue/barrier layer is included between the first metal layer and the slanted side wall of the self align contact window.

13. The structure of claim 12, wherein the glue/barrier layer includes titanium/titanium nitride.

14. A capacitor, comprising:
    a substrate, wherein a transistor having a gate and a source/drain region is formed on the substrate;

an insulating layer over the transistor, wherein there is a self align contact window through the insulating layer exposing the source/drain region and wherein the self align contact window has a slanted side wall;

a first metal layer on the slanted side wall of the self align contact window and on the source/drain region, wherein the first metal layer serves as a lower electrode of the capacitor;

a glue/barrier layer interposed between the first metal layer and the slanted side wall of the self align contact window;

a TiSi$_2$ layer formed around an interface between the source/drain region and the glue/barrier layer;

a dielectric layer covering the first metal layer; and a second metal layer covering the dielectric layer, wherein the second metal layer serves as an upper electrode of the capacitor.

15. The structure of claim 14, wherein the transistor comprises a spacer formed on a sidewall of the gate, the self align contact window exposes a portion of the spacer, and the first metal layer is further on the portion of the spacer.

* * * * *